(12) United States Patent
Kuhara et al.

(10) Patent No.: US 6,863,449 B2
(45) Date of Patent: Mar. 8, 2005

(54) PARALLEL LIGHT EMITTING DEVICE—PHOTOSENSITIVE DEVICE MODULE

(75) Inventors: Yoshiki Kuhara, Osaka (JP); Naoyuki Yamabayashi, Kanagawa (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 165 days.

(21) Appl. No.: 10/354,669

(22) Filed: Jan. 30, 2003

(65) Prior Publication Data

US 2003/0152338 A1 Aug. 14, 2003

(30) Foreign Application Priority Data

Feb. 8, 2002 (JP) ........................................ 2002-032453

(51) Int. Cl.[7] ................................................ G02B 6/36
(52) U.S. Cl. .............................. 385/89; 385/14; 385/49; 385/92
(58) Field of Search ........................ 385/14, 49, 88–94; 398/164

(56) References Cited

U.S. PATENT DOCUMENTS 6,480,639 B2 * 11/2002 Hashimoto et al. ........... 385/14

FOREIGN PATENT DOCUMENTS

JP 11-068705 3/1999

OTHER PUBLICATIONS

M. Shishijura, K. Nagatsuma, T. Ido, M. Tokuda, K. Nakahara, E. Nomoto, I. Sudoh and H. Sano, "10Gbps N 4–channel parallel I.D module". Proceeding of the 2001 Communications Society Conference of HEICF. C–3–50. P160 (2001).

* cited by examiner

*Primary Examiner*—Frank G. Font
*Assistant Examiner*—Michael P. Mooney
(74) *Attorney, Agent, or Firm*—Fish & Richardson P.C.

(57) ABSTRACT

A parallel multichannel LD/PD module comprising a bench, a set of M (M; channel number) curving lightpaths (lightwaveguides or optical fibers) having a narrow width region, a width enlarging region and a wide width region which are formed upon the bench, a wavelength selective filter provided at the wide width region for reflecting receiving beams upward, a set of photodiodes installed in front of the wavelength selective filter at the wide width region above the bench and light emitting devices mounted behind the ends of the lightpaths with a wide pitch for yielding transmitting beams. Propagating in outer M-channel element fibers of a ribbonfiber, receiving signal beams go into the lightpaths via the narrow width region, expand horizontally in the width enlarging region, arrive at the wide width region, and are reflected by the wavelength selective filter upward. The receiving beams go into the photodiodes which yield photocurrents in proportion to the powers of the receiving beams. Transmitting signal beams produced by the light emitting devices (LDs or LEDs) go into the lightpaths via the wide width region ends, run in the lightpaths, go out of the lightpaths from the narrow width region ends and go into M element fibers of an external ribbonfiber. An enlarging rate D/d should be 1.5 to 6. The wide width region enables the module to accommodating laser diodes with a sufficient margin, which lowers electric crosstalk among the laser diodes. Long distances between the photodiodes and the laser diodes alleviate optical, electromagnetic and electric crosstalk between the photodiodes and the laser diodes.

20 Claims, 9 Drawing Sheets

Embodiment 1

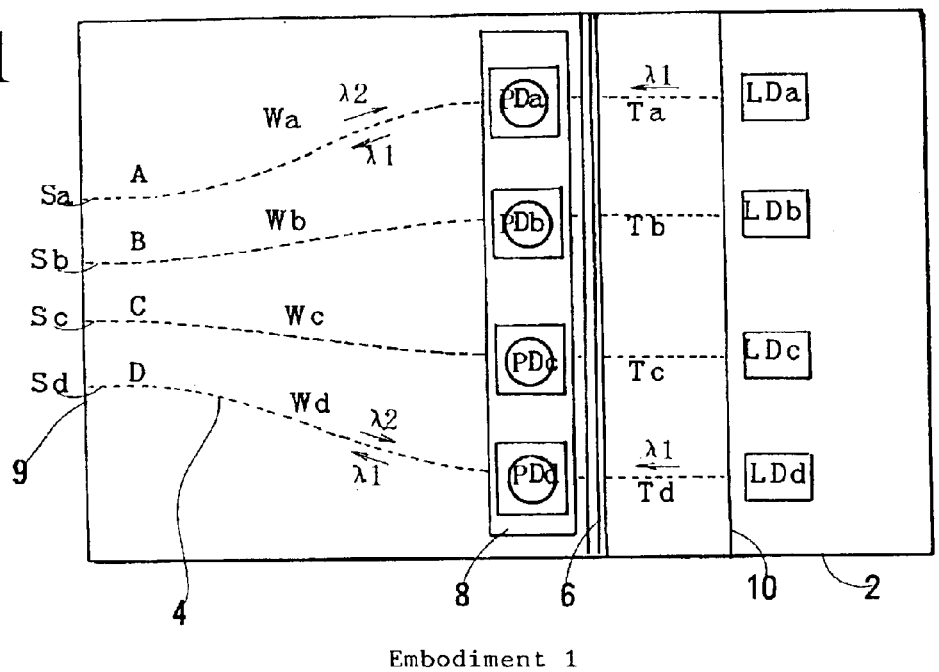
Fig.1  Embodiment 1
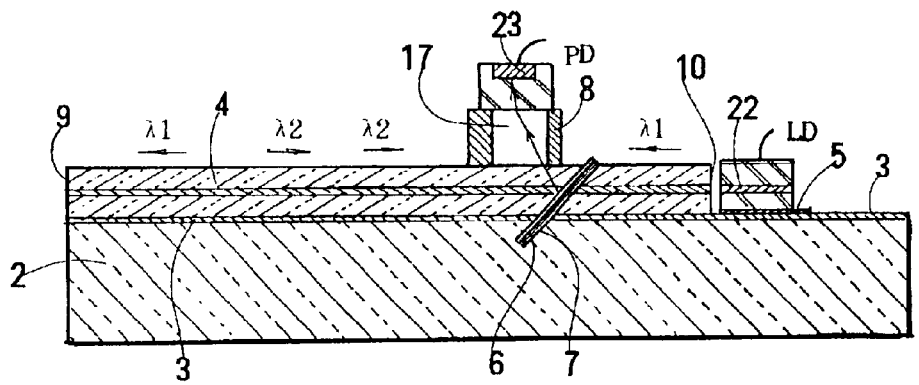
Fig.2  Embodiment 1

Fig.12 Embodiment 5,6
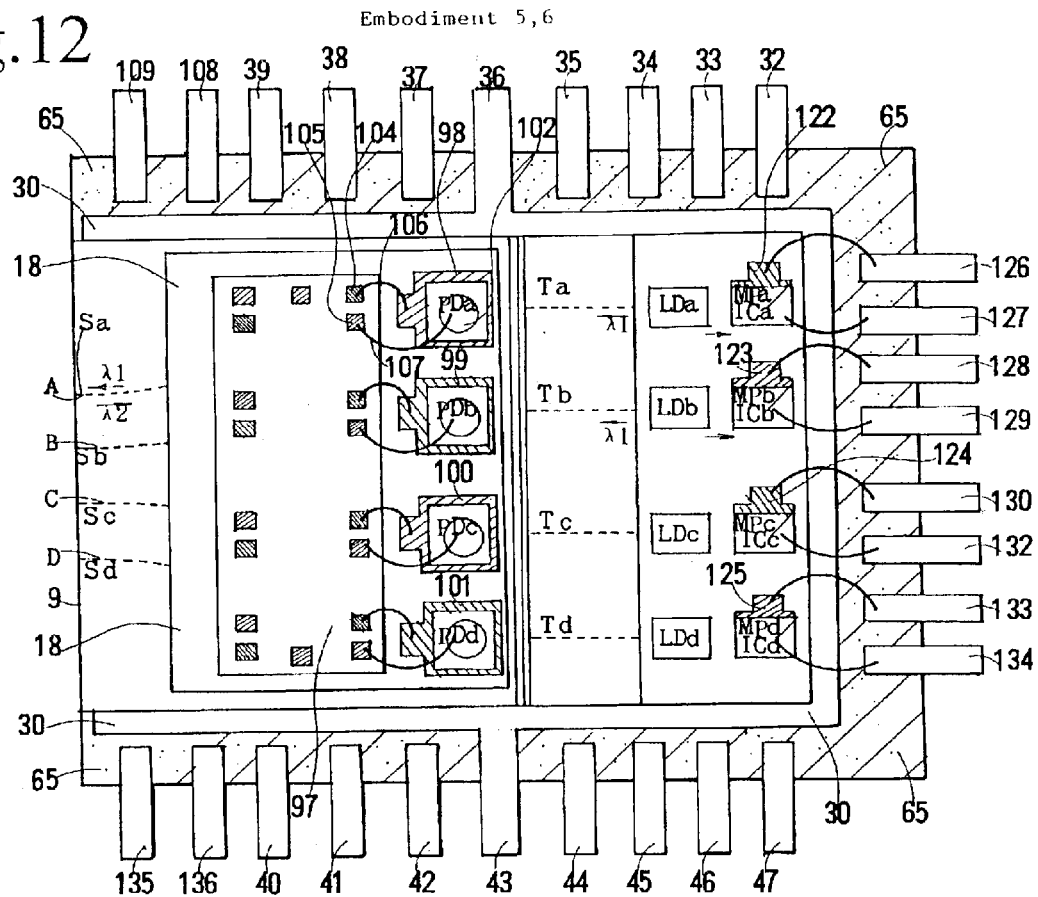
Fig.13 Embodiment 5,6
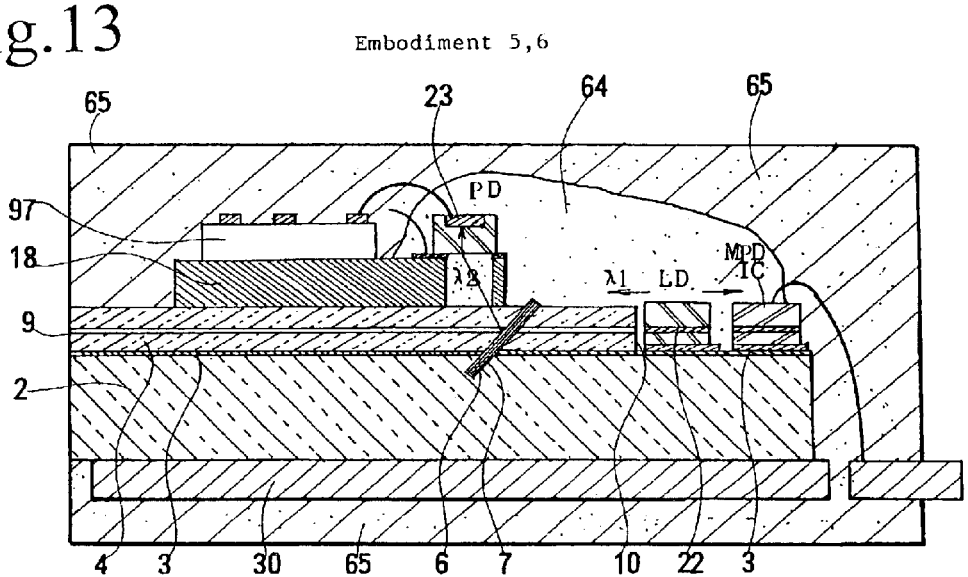

Embodiment 7

PARALLEL LIGHT EMITTING DEVICE—PHOTOSENSITIVE DEVICE MODULE

BACKGROUND OF THE INVENTION

1. Field of the Invention

This invention relates to a parallel LD/PD module which simultaneously transmits and receives a plurality of optical signals via a plurality of optical fibers. A parallel communication system make use of a ribbonfiber containing four, eight, sixteen or, in general, $2^m$ (m; integer) parallel element fibers for transmitting a plurality of optical signals. The number $M$ $(=2^m)$ of channels is equal to the number of element fibers. A diameter of a cladding of a single-mode fiber is 125 $\mu$m. A standardized ribbonfiber includes parallel element fibers at a pitch of 250 $\mu$m. A ribbonfiber has $2^m=M$ (4, 8, 16, 32, ...) element fibers at a 250 $\mu$m pitch in parallel.

Photodiode chips for optical communications are a square of about 500 $\mu$m×500 $\mu$m. Laser diode chips are a square of a side larger than 300 $\mu$m. An M $(=2^m)$ channel LD/PD module should be equipped with M laser diodes and M photodiodes. If M parallel lightpaths are formed at a 250 $\mu$m pitch, which is equal to the pitch of the ribbonfiber, in an LD module, laser diodes cannot be mounted at ends of parallel light paths of 250 $\mu$m pitch.

This application claims the priority of Japanese Patent Application No. 2002-032453 filed on Feb. 8, 2002, which is incorporated herein by reference.

2. Description of Related Art

① Masato Shishikura, Kazuyuki Nagatuma, Tatsumi Ido, Masahide Tokuda, Koji Nakahara, Etsuko Nomoto, Tsurugi Sudoh & Hirohisa Sano, "10 Gbps×4 channel parallel LD module", Proceeding of the 2001 Communications Society Conference of IEICE General Conference, C-3-50, p160 pointed out problems of large crosstalk, interference, heating and fluctuation of properties induced among laser diodes which would be arranged at a narrow pitch in a parallel LD module. ① proposed an improvement of a parallel LD module having width enlarging lightwaveguides for joining element fibers of a ribbonfiber at a front end and joining laser diodes at a rear end.

FIG. 16 shows a perspective view of a module proposed by ①. The module has a silicon bench (or base) 222 having a Si (100) plane surface. The silicon bench has $SiO_2$ type lightwaveguides on the top surface. The lightwaveguides consist of a lower cladding layer, an intermediate core and an upper cladding layer. The cladding layers are made of silicon dioxide ($SiO_2$). The core is a germanium (Ge) doped silicon dioxide ($SiO_2$) square-sectioned line. The proposed one is a four channel LD module which has four lightwaveguides (cores) A, B, C and D. A unit distance of repetitions of guides or fibers is called a "pitch", or a "spatial period" or simply a "period". The pitch of the cores of the lightwaveguides is 250 $\mu$m at an initial part (front ends). The width between neighboring cores expands at an intermediate region. The pitch of the cores is 1000 $\mu$m (1 mm) at a rear part (back ends). Four laser diodes LDa, LDb, LDc and LDd are mounted with a 1000 $\mu$m pitch at back ends of the cores on a rear region of the silicon bench 222.

Aforecited ① enlarges the pitch of lightpaths from 250 $\mu$m, which is a standardized pitch of typical flat multifibers or tapefibers, to 1000 $\mu$m (1 mm) for admitting laser diodes to occupy enough areas. The intermediate width enlarging region widens the lightpath pitch to four times as wide as the original value. ① describes that the crosstalk between neighboring laser diodes (LDa and LDb; LDb and LDc; LDc and LDd) is as small as −40 dB at a signal frequency of 10 GHz. The large spacing is required for suppressing the crosstalk between signal generating laser diodes by ①. The intermediate width expanding region is necessary for allowing the lightwaveguides to mount laser diodes at final ends and reducing mutual crosstalk among the LDs. Smooth pitch enlargement requires a long silicon bench of a length between 15 mm and 20 mm. Long lightwaveguides incurs a large silicon bench and a bulky LD module.

Futuristic high speed parallel transmission requires such a configuration of arranging a set of individual laser diodes (LDs) at ends of parallel lightwaveguides. Allocation of individual laser diode chips allows the module to select an p-type substrate laser diode or an n-type substrate laser diode freely. A variety of oscillation frequencies can be assigned to the individual laser diodes (LDs). Adoption of the individual laser diodes enhances the freedom of designing.

The known reference ① shows only a transmuting device without a receiving device. A receiving device containing plural photodiodes would be prepared as an independent device isolated from the transmitting device. The separated receiving device would require another set of element fibers for guiding receiving optical signal beams. Two (transmitting and receiving) signals of the same wavelength propagate, for example, 1.3 $\mu$m in two independent sets of ribbonfibers. Since the transmitting device is independent from the receiving device and two independent devices utilize two independent sets of ribbonfibers, no crosstalk occurs between the receiving device and the transmitting device in ①. Namely the known reference ① is a binary fiber type which requires one ribbonfiber for a transmitting device and another ribbonfiber for a receiving device. An M-channel bidirectional communications requires 2M element fibers instead of M element fibers. Low crosstalk is an advantage of ①. But the binary fiber type ① would be a large-sized, high-cost module which requires two sets of ribbonfibers, an independent receiving device and an independent transmitting device.

If a four channel parallel communications system (M=4) were constructed in accordance with the teaching of the binary fiber type ①, a module would require an independent four channel receiving device, an independent transmitting device, and eight parallel element fibers (two fibers per channel; 4×2=8). Installation of binary sets of fibers would raise the cost of constructing the binary system.

A preferable module is a module which enables an optical communication network to bring four channel signals in both directions by four fibers instead of eight fibers. A purpose of the present invention is to provide a multichannel LD/PD module which enables M optical fibers to carry M channel signals simultaneously in both directions. Namely the number of the fibers is equal to the number of the channels. Another purpose of the present invention is to provide a multichannel LD/PD module of low-cost and small-size. A further purpose of the present invention is to provide a multichannel LD/PD module which can alleviate optical, electrical and electromagnetic crosstalk between a transmitting portion and a receiving portion.

A single fiber type, single-channel LD/PD module which horizontally disposes a wavelength selective filter, a laser diode (LD) and a photodiode (PD) on $SiO_2$ type lightwaveguide layer formed on a silicon bench has been known. For example, ② Japanese Patent Laying Open No.11-68705, "TWO-WAY WDM OPTICAL TRANSMISSION RECEPTION MODULE" proposed a single-channel LD/PD module which has a silicon bench, a y-branched SiO₂ lightwaveguide formed on the silicon bench, a laser diode (1.3 μm) deposited at an upper left end of "y", a photodiode (1.55 μm) deposited at a bottom end of "y", an end of a fiber fitted at a upper right end of "y" and positions a WDM (wavelength division multiplexer) at the branch for allowing 1.55 μm to pass and reflecting 1.3 μm at a 120 degree reflection angle. On the silicon bench, the 1.3 μm LD beam depicts a V-shaped locus and the 1.55 μm PD beam a/-shaped locus. The known reference ② contrives to reduce electrical crosstalk by positioning the LD and the PD in reverse directions regarding the WDM. Since ② is a module on an ONU (optical network unit; subscriber), a single-channel is sufficient.

An ONU is satisfied with a module having a single LD (1.3 μm) and a single PD (1.55 μm). The relation of the wavelengths is reversed for an ONU and a station. The central station should be equipped with a station module having an LD which emits 1.55 μm and a PD which senses 1.3 μm. The central station may utilize single-channel modules similar to the module of an ONU. The central station should have N single-channel modules for exchange signals with N ONUs. N, which is the number of ONUs, is a very large number. Installation of N single-channel modules would occupy a vast volume in the central station.

Instead of single-channel modules, multi-channel modules are favorable for a central station for alleviating the space of installing communication modules at the station. Most of the volume of a module is consumed by benches, packages and cases. PDs, LDs and lightpaths are small elements. A multichannel module, for example, four channel, eight channel, sixteen channel, or thirty-two channel module would be made to be a small size nearly equal to a single-channel one. A demand of multichannel modules for station modules occurs. An extension of the teaching of the single-channel ② that couples PDs and LDs to fibers by horizontal, planar y-branches may be a candidate of multichannel modules. The virtual extension model, which may be called a planar type which connects individual sets of a laser diode and a photodiode by a y-branch on a silicon bench, would consume a huge space for a plurality of y-branches on the silicon bench. The virtual planar M-channel module would be similar to a series of horizontally aligning M single-channel modules. Such a planar type is insignificant for the purpose of reducing size and cost of station communication modules.

If photodiodes (PDs) were provided near laser diodes (LDs) for the sake of reducing the module size, LD/PD access would raise optical crosstalk and electrical crosstalk between the LDs and the PDs. Large optical, electrical crosstalk prohibits the LD modules from transmitting optical signals simultaneously in bilateral directions. An enough distance should be maintained between PDs and LDs in the longitudinal direction and in the lateral direction for suppressing the LD/PD crosstalk.

What is the reason that conventional single-channel bidirectional LD/PD modules should require such a wide two-dimensional extension of, for example, ② Japanese Patent Laying Open No.11-68705 which unifies and divides a transmitting beam and a receiving beam by a y-branch horizontally formed on a silicon bench ? The reason causing such a wide extension is that conventional bidirectional modules two-dimensionally divide and unify two different wavelengths (e.g., 1.3 μm and 1.55 μm) on a common level of the silicon bench. Planar, two-dimensional unification or division of two beams causes such a y-branch which forces a silicon bench to consume a wide area.

Area-consumptive y-branches contradict the requirement of producing small-sized LD/PD modules. ②, which is a single-channel LD/PD module which has a single LD and a single PD, may submit to enlargement of size induced by the planar y-branch. Multichannel transmission will urge LD/PD modules to reduce the size.

A single bidirectional LD/PD module has an intrinsic weak point of electrical crosstalk and optical crosstalk between a laser diode and a photodiode. Access of PD/LD increases the crosstalk. Large crosstalk disturbs optical communications. A photodiode should be far separate from a laser diode for reducing crosstalk in an LD/PD module. For the purpose, the known reference ② positions the photodiode at a bottom end point of "y" far distanced from the laser diodes laid at a top left end of "y". The separation increases the length of the silicon bench. Allotment of a wide planar distance between a laser diode and a photodiode contradicts the purpose of reducing the size of a module.

SUMMARY OF THE INVENTION

The present invention proposes multichannel LD/PD modules which have a plurality of transmitting portions (light emitting devices), a plurality of receiving portions (photodiodes) and a plurality of lightpaths for transmitting and receiving a plurality of data signals simultaneously and bidirectionally. Futuristic multichannel LD/PD modules will satisfy the following requirements.

(1) Long distances among a plurality of laser diodes for reducing crosstalk among the laser diodes.
(2) Long distances between laser diodes and photodiodes for reducing crosstalk between the laser diodes and photodiodes.
(3) Size-reduction and low-cost which require planar lightguide circuit (PLC) technique suitable for large-scale production.

A parallel LD/PD module of the present invention is a multichannel LD/PD module compatible to the multichannel optical communications. The multichannel parallel LD/PD module has a bench, (or base) a set of curving lightpaths having a narrow width region, a width enlarging region and a wide width region which are formed upon the bench, a wavelength selective filter provided at the wide width region for reflecting receiving beams upward, a set of photodiodes or photodiode array installed slanting upward in front of the wavelength selective filter at the wide width region above the bench and light emitting devices or array of light emitting devices mounted behind the ends of the lightpaths with a wide pitch for yielding transmitting beams. Propagating in outer M-channel element fibers of a ribbonfiber, receiving signal beams go into the lightpaths via the narrow width region, expand horizontally in the width enlarging region, arrive at the wide width region, and are reflected by the wavelength selective filter upward. The receiving beams go into the photodiodes which yield photocurrents in proportion to the powers of the receiving beams. The transmitting signal beams produced by the light emitting devices (LDs or LEDs) go into the lightpaths via the wide width region ends, run in the lightpaths, go out of the lightpaths from the narrow width region ends and go into M element fibers of an external ribbonfiber.

The lightpaths whose number is equal to the number of the channel can be either lightwaveguides or optical fibers. In the case of optical fibers, curving V-grooves should be formed on the bench and the optical fibers should be embedded in the curving V-grooves. In the case of lightwaveguides, inorganic SiO₂ lightwaveguides or organic polyimide lightwaveguides are produced on the bench.

Long width enlarging portions are indispensable for the curving lightpaths for expanding the pitch of the lightpaths without bending loss. A larger ration D/d (d; smaller pitch, D; larger pitch) requires a longer width enlarging portion. The long width enlarging region can be utilized by preparing metallized wirings for the photodiodes or installing a preamplifier for the photodiodes.

The rear portion of the bench is provided with the laser diodes. Optionally, monitoring photodiodes are furnished behind the laser diodes for monitoring the powers of the laser diodes by catching rear emitting light of the laser diodes. Otherwise, an LD driving IC may be installed behind the laser diodes for accelerating the response of the laser diodes.

The present invention proposes a multichannel parallel LD/PD module having the following properties.

(1) A plurality of curving lightpaths whose number is equal to the number of the channel are made on a bench. The curving lightpaths have an initial narrow width region whose pitch d is equal to the pitch of a standardized ribbonfiber, an intermediate curving width enlarging region and a final wide width region with a large pitch D suitable for aligning laser diodes at extensions of the lightpaths. A ratio D/d of the wider pitch to the narrower pitch should be 1.5 to 6. A preferable scope of the ratio D/d is 2 to 4. The pitch of the standardized ribbonfibers is 250 $\mu$m. Thus the initial pitch p is 250 $\mu$m in the case. The preferable wider pitch D should be 375 $\mu$m to 1500 $\mu$m. The lightpaths should be either optical fibers or lightwaveguides. The lightwaveguides as lightpaths may be either inorganic $SiO_2$ type lightwaveguides or organic polyimide lightwaveguides.

(2) A wavelength selective filter of reflecting only receiving beams upward is fitted at an intermediate point on the wide width region of the lightpaths. $\lambda_1$ is a wavelength of receiving beams and $\lambda_2$ is a wavelength of transmitting beams. The wavelength selective filter has a function of allowing $\lambda_1$ coming from the rear lasers to pass and reflecting $\lambda_2$ coming from the front ribbonfiber slantingly upward.

(3) A plurality of photodiodes (PDs) are mounted slanting upward in front of the slanting wavelength selective filter halfway on the wide width region. The photodiodes sense the receiving beams reflected upward by the wavelength selective filter. The receiving devices can be a set of individual photodiodes, a photodiode array or a photodiode with an arrayed sensing region.

(4) A plurality of light emitting devices (laser diodes LDs or light emitting diodes LEDs) are furnished behind the final ends of the lightpaths of the wide width region. The light emitting devices (LDs or LEDs) produce transmitting signal beams and give the signal beams to the lightpaths.

(5) There is neither light emitting devices nor photodiodes upon the width enlarging region of the lightwaveguide layer. Preferably, metallized wirings or preamplifiers should be installed upon the width enlarging region of the lightwaveguide layer.

(6) For an easy optical, mechanical connection to external ribbonfiber (MT connector), guidepins and guideholes are equipped on the bench.

(7) Optionally, monitoring photodiodes can be added behind the laser diodes for monitoring the powers of the laser diodes and maintaining the powers at a constant level. Otherwise, an LD driving IC can be mounted behind the laser diodes for driving the laser diodes, which has an advantage of accelerating responses of the laser diodes by alleviating inductance of wirings.

(8) Half-products are packaged by resin molding into a completed LD/PD modules. Plastic packages are produced by transfermolding the half-products with an epoxy resin. Hard plastic packages protect LD/PD devices from shocks, forces, water and contamination.

BRIEF DESCRIPTION OF THE DRAWINGS

FIG. 1 is a plan view of a substrate part of a parallel LD/PD module as Embodiment 1 endowed with basic features of the present invention.

FIG. 2 is a vertical section of the substrate part of Embodiment 1 of the parallel LD/PD module.

FIG. 12 is a plan view of Embodiment 5 or 6 having a submount upon a width enlarging region, PDs and preamplifiers (AMPs) mounted on the submount for preamplifying photocurrents of the PDs, LDs fitted at rear ends of the substrate and monitoring photodiodes (MPDs) for detecting the LDs or LD-driving ICs for driving the LDs provides at the rear behind the LDs.

FIG. 13 is a vertically sectional view of Embodiment 5 or 6 having the submount upon the width enlarging region, the PDs and the preamplifiers (AMPs) mounted on the submount for preamplifying photocurrents of the PDs, the LDs fitted at the rear ends of the substrate and monitoring photodiodes (MPDs) for detecting the LDs or the LD-driving ICs for driving the LDs provides at the rear behind the LDs.

DETAILED DESCRIPTION OF THE PREFERRED EMBODIMENTS

Figure 3:
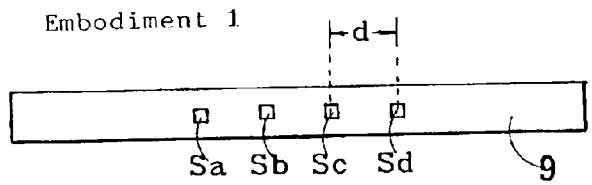
FIG. 3 is a front view of a lightwaveguide layer formed upon the substrate of the parallel LD/PD module of Embodiment 1.

[Embodiment 1 (Fundamental Structure; FIG. 1, FIG. 2, FIG. 3, FIG. 4)]

FIG. 1 is a plan view of a substrate portion of an LD/PD module as Embodiment 1. FIG. 2 is a vertical section of the same. The LD/PD module has a rectangular silicon bench 2 which contains a set of width enlarging lightpaths, a transmitting portion and a receiving portion built on the top surface. The light path set has a narrow width region at a front, a width enlarging region at a middle and a wide width region at the back on the silicon bench. The narrow pitch of the front narrow width region enables the individual lightpaths to couple to fibers in a tapefiber by a physical contact. Both the receiving portion and the transmitting portion are formed upon the wide width region via an insulating submount for annihilating optical, electrical crosstalk between the transmitting portion and the receiving portion. The number of channels M is equal to the number of the lightpaths. The channel number M is $1, 4, 8, 16, \ldots, 2^m$ (m: integer), etc. FIG. 1 depicts a case of M=4 as an example. For any other M, the structure is similar to the depicted example. The lightpath means either a lightwaveguide or an optical fiber. FIG. 1 shows a lightwaveguide type lightpath. Cores of the lightwaveguides or the fiber, which carry light signals, are commonly called "lightpaths" in general.

A thin insulating layer 3, e.g., silicon dioxide ($SiO_2$) is produced upon the rectangular silicon bench 2. An waveguide layer 4 is made upon the insulating layer 3. The waveguide layer, which is made of a transparent material, contains four lightpaths A, B, C and D therein. The waveguide layer is a cladding portion with a lower refractive index. The lightpaths A, B, C and D are narrow, continual cores having a higher refractive index. The cores are sandwiched between an upper and lower cladding layers which are parts of the waveguide layer 4. The waveguide layer 4 covers the front region and the middle region of the silicon bench 2.

The insulating layer 3 is exposed at a rear part of the silicon bench 2. Metallized patterns 5 are made upon the insulating layer 3 of the rear region. Four laser diodes LDa, LDb, LDc and LDd are mounted upon metallized pads of the wirings. The lightpaths A, B, C and D built in the waveguide layer 4 have three different portions, a front narrow width region of Sa, Sb, Sc and Sd, a middle width enlarging region of Wa, Wb, We and Wd and a final wide width region of Ta, Tb, Tc and Td. Individual four lightpaths A, B, C and D have continual separated loci of Sa-Wa-Ta, Sb-Wb-Tb, Sc-Wc-Tc and Sd-Wd-Td.

The front narrow width region is a part for couple with a tapefiber. The middle width enlarging region is a part for expanding the pitch of neighboring paths. The final wide width region is allocated with a sufficient pitch for coupling to laser diodes (LDs) and photodiodes (PDs). An allowable rate D/d of the wider pitch D to the narrower pitch d is D/d=1.5 to 6. For example, D/d=2 in Embodiment 1. When the pitch d of the tapefiber (ribbonfiber) is 250 μm, the pitch D of the wide width region is D=500 μnm.

The curving lightpaths A, B, C and D are converted to the wide width region of Ta, Tb, Tc and Td on the rear half of the silicon bench 2. The receiving portion is installed at a forward portion of the wide width region of Ta, Tb, Tc and Td. The transmitting portion is installed at an extension of the rear ends of the wide width region of Ta, Tb, Tc and Td. The final ends of Ta, Tb, Tc and Td are exposed on a vertical rear end 10 of the lightwaveguide layer 4. Laser diodes LDa, LDb, LDc and LDd are epi-down (upside down) fitted upon the metallized patterns 5 on the rear end of the insulating layer behind the ends of the lightpaths. Active stripes of the laser diodes are laid on extensions of the lightpaths Ta, Tb, Tc and Td. Transmitting light beams forward emitted from the laser diodes LDa, LDb, LDc and LDd go into the rear ends of the lightpaths Ta, Tb, Tc and Td and propagate into four element fibers of a ribbonfiber ($2^m=2$; m=2 in the case) (tapefiber).

A wavelength selective filter 6 is embedded into a horizontal, lateral, slanting groove 7 perforated at the wide width region on the lightwaveguide layer 4. The wavelength selective filter 6 plays a role of reflecting PD receiving light from the ribbon fiber and allowing transmitting LD light to pass. A submount 8 with a top metallize and vertical partitioned holes is installed on the wide width region of the lightwaveguide layer 4 in front of the wavelength selective filter 6. Signal receiving photodiodes PDa, PDb, PDc and PDd are upholstered on the submount just above the lightpaths Ta, Tb, Tc and Td. The photodiodes PDa, PDb, PDc and PDd are bottom incidence type photodiodes having a sensing portion 23 (pn-junction) at the top.

Propagating in four element fibers of the ribbonfiber, receiving optical signal beams, go into the four lightpaths A, B, C and D via Sa, Sb, Sc and Sd of the narrow width region, expand sideways at Wa, Wb, Wc and Wd of the enlarging region, and reach Ta, Tb, Tc and Td of the wide width region. The receiving beams are reflected slantingly upward by the wavelength selective filter 6, pass via the vertical holes with partitions of the submount, go into the bottom incidence type photodiodes PDa, PDb, PDc and PDd, and induce photocurrents in PDa, PDb, PDc and PDd.

Instead of the bottom incidence type, top incidence type photodiodes are also available. In the case of the top incidence type, photodiodes should be epi-down (upside down) mounted upon the metallized submount. Anodes (p-electrode) of photodiodes, which should be insulated from each other, should be bonded upon isolated metallized patterns on the submount.

FIG. 3 is a front view of only the lightwaveguide layer 4 for showing a narrow pitch d of the front ends 9 Sa, Sb, Sc and Sd of the narrow width region.

Figure 4:
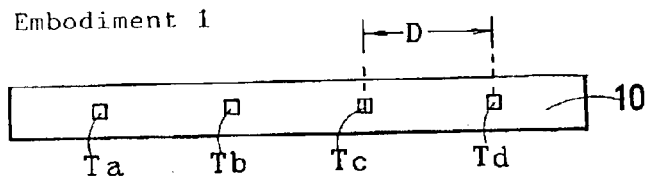
FIG. 4 is a rear view of the lightwaveguide layer formed upon the substrate of Embodiment 1.

FIG. 4 is a rear view of the back end 10 of the lightwaveguide layer 4. Wide back ends Ta, Tb, Tc and Td of the lightwaveguides A, B, C and D appear on the back end with a common spacing. The final pitch D is large. The wide pitch D gives the laser diodes enough wide margins, which reduce the LD/PD crosstalk between the LDs and the PDs and the LD/LD crosstalk between neighboring LDs.

In the embodiment, both the transmitting part (LDs) and the receiving part (PDs and WDM) are installed on the back wide width region containing Ta, Tb, Tc and Td. The PDs are separated by a large pitch D. PD/PD crosstalk is small. The LDs are also distance by a large pitch D. LD/LD crosstalk is weak.

A single mode fiber has a core of a 10 μm diameter and a cladding of a 125 μm diameter. The tapefibers which hold parallel four cores, eight cores, sixteen cores, ... with a pitch in a flat resin tape have been produced and sold on the market. The pitch of element fibers in the standardized tapefibers is 250 μm. Since the cladding has a 125 μm diameter, a distance between the claddings of neighboring fibers is 125 μm. The pitch at the front end which connects to a tapefiber should be 250 μm in multichannel modules. The intermediate region enlarges the pitch of light-waveguide cores to a large final end pitch D. A magnifying ratio D/d is an arbitrary determinable parameter. When the magnifying ratio D/d is D/d=1.5 to 6 for the standard case of d=250 μm, the final pitch D can be D=375 μm to 1500 μm. A wider final pitch D ensures lower crosstalk. A longer intermediate region and a larger silicon bench are required for raising the pitch D. An optimum magnifying ratio D/d should be determined for conciliating crosstalk reduction and a cost increment.

In general, laser diode chips are squares having a side of 300 μm to 500 μm. Prevalently used laser diodes have at least a size of a 300 μm×300 μm square. The standardized ribbon fiber has $2^m$ (m; integer) element fibers which are arrayed in parallel at a pitch of 250 μm. It is impossible to arrange laser diodes at the same pitch as the 250 μm pitch of the standardized ribbonfibers. This invention solves the difficulty of the pitch discrepancy by making the best use of enlarging lightpaths. The enlarging curving lightpaths have an initial narrow width region which has the same pitch as the ribbonfiber, an intermediate enlarging region and a final wide width region having a pitch from 375 μm to 1500 μm which is suitable for mounting laser diodes separately. For example, if a ratio of the wider pitch D to the narrower pitch p is assumed to be D/d=2, the wider pitch is D=500 μm. D=500 μm allows the transmitting portion to align laser diodes (LDs) of a 300 μm to 400 μm side with enough margins.

Photodiode chips are a square of a side of 300 μm to 600 μm in general. A final pitch D=500 μm, which is obtained by doubling pitch of waveguide cores, for D/d=2 enables photodiodes of a 300 μm square to 400 μm square to align with a gap via a 500 μm pitch submount on the final region of the waveguides. A photodiode array of a 500 μm pitch can also be mounted on the submount. In the case of a photodiode array, n-electrodes are gathered to a common cathode. A reverse bias is commonly given by connecting the common cathode with a positive terminal of a power source. A further D=750 μm pitch for D/d=3 allows 500 μm square photodiode chips to align on the final region without mutual contact.

A submount 8 can be produced from a ceramics, e.g., alumina ($Al_2O_3$). The submount has a top metallized pads, on which cathodes of bottom incidence type photodiodes (PDs) are directly bonded. The submount has a plurality of vertical holes, in this case, four vertical holes. Partition walls 17 separate vertical holes. Receiving light beams selectively reflected by a WDM filter pass the vertical holes, enter the photodiodes via bottoms and produce photocurrents in proportion to the power of receiving light signals. The partition walls, which shield object beams from neighboring beams, reduce optical PD/PD crosstalk among the receiving signal beams. The submount decreases optical LD/PD crosstalk by lifting the PDs from the level of the LDs by the submount height. Unlike the silicon bench having conductivity, the submount, which is an insulator, annihilates electrical LD/PD crosstalk between the PD part and the LD part.

The WDM filter has a wavelength selective function of admitting transmitting light from the LDs to pass and reflecting receiving signal light slantingly upward toward the PDs. The WDM filter is produced by piling thin dielectric films of different refractive indices and different thickness on a transparent substrate, e.g., of a polyimide in turn by evaporation or sputtering.

In M channels, the transmitting lights $\lambda_1$(1.3 μm) and the receiving lights $\lambda_2$ (1.55 μm) are sometimes equal. But there is another case that $\lambda_1$ and $\lambda_2$ have little different wavelengths with a pitch Δ. In the case of the same wavelengths, the WDM filter 6 can be the same layers structure common to all the channels. So that a single WDM filter is available. In the case of different wavelengths, the transmitting beams are $\lambda_1+j\Delta(j=1,2 \ldots M)$ and the receiving beams are $\lambda_2+j\Delta(j=1,2 \ldots M)$. It is necessary that WDM filters having different layers structure should be formed per each channel.

Figure 5:
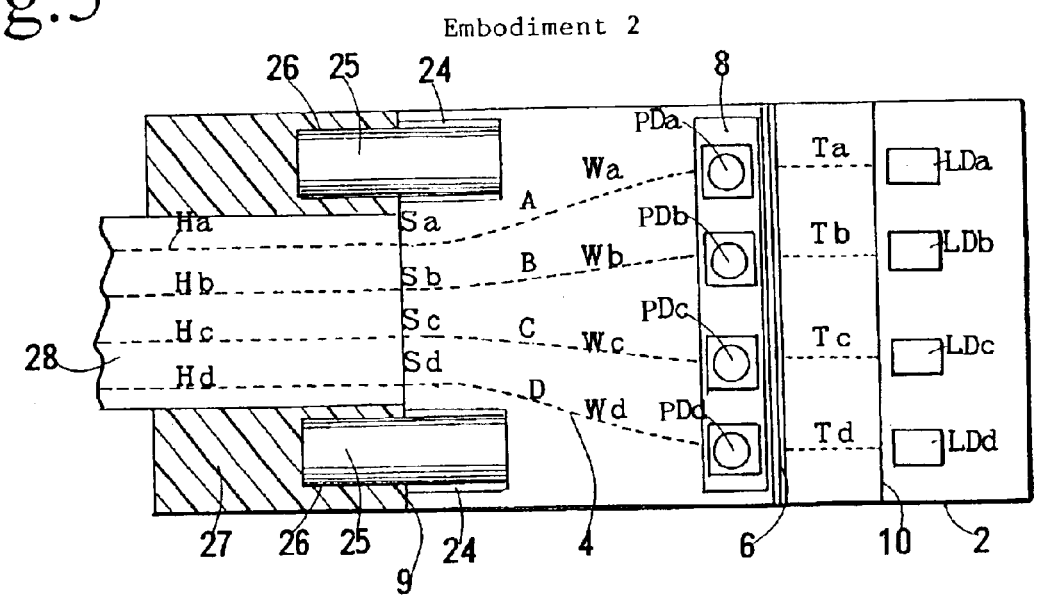
FIG. 5 is a plan view of Embodiment 2 of the present invention which has guidepins on a front surface for coupling with a tapefiber connector.
Figure 6:
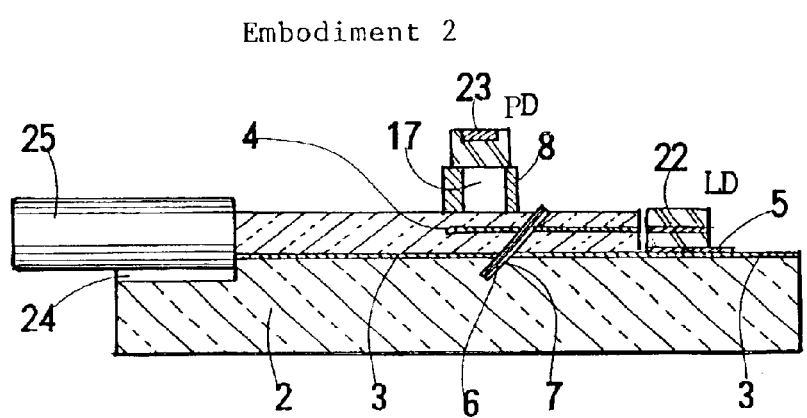
FIG. 6 is a side view vertically sectioned along a guidepin of Embodiment 2 with the guidepins of the front end.
Figure 7:
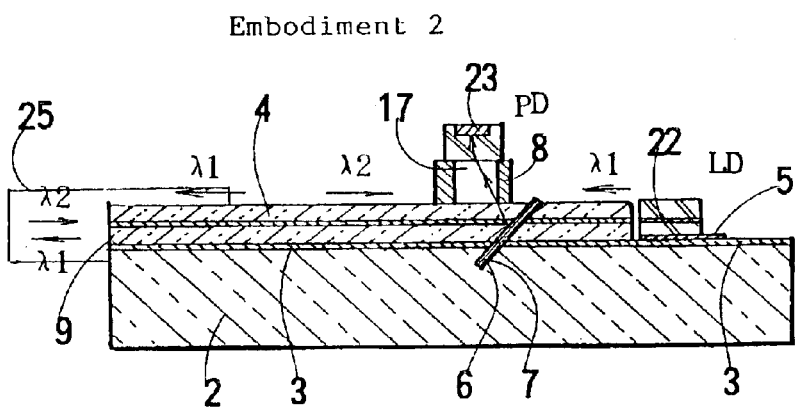
FIG. 7 is a side view vertically sectioned along a lightwaveguide of Embodiment 2.

[Embodiment 2 (Guidepin Coupling; FIG. 5, FIG. 6, FIG. 7)]

The present invention further proposes another embodiment which is provided with a contrivance for coupling to a standardized connector, for example, an MT connector which holds an end of a ribbonfiber with M parallel element fibers (M=4, 8, 16 . . . ). An element single-mode fiber has a 125 μm diameter cladding. A core-core spatial distance (pitch or period) has been determined to be 250 μm for ribbonfibers. Embodiment 2 allocates guidepins to a LD/PD module and guideholes to the MT connector for facile coupling between the module and the MT connector. FIG. 5 is a plan view of a bench portion of Embodiment 2. FIG. 6 is a sectional side view cutting in a vertical plane containing a guidepin. FIG. 7 is another sectional side view cutting in another vertical plane including a lightwaveguide core. Except the guidepins, Embodiment 2 is similar to Embodiment 1.

Embodiment 2 has a rectangular silicon bench 2, a plurality of width-enlarging lightpaths formed on the silicon bench 2, a transmitting portion containing a plurality of light emitting devices(laser diodes or light emitting diodes), a receiving portion containing a plurality of signal sensing devices (photodiodes), guidepins fitted on a front region of the silicon bench.

The silicon bench has a thin insulating layer 3, for example, a silicon dioxide layer ($SiO_2$) thereupon. A transparent lightwaveguide layer 4 is formed upon the insulating layer 3. Four curving lightpaths (lightwaveguide cores) A, B, C and D are made in the transparent lightwaveguide layer 4. The lightwaveguide layer 4 is a cladding having a lower refractive index. The lightpaths are cores having higher refractive index. Signal beams propagate in the lightpaths which are the cores in the lightwaveguide layer.

Metallized patterns 5 are made upon at a rear end on the insulating layer 3 of the silicon bench 2 for mounting laser diodes as shown in FIG. 6 and FIG. 7.

The four curving lightpaths A, B, C and D (four channel example) formed in the lightwaveguide layer 4 are divided into an initial parallel narrow width region Sa, Sb, Sc and Sd, a middle curving width enlarging region Wa, Wb, Wc and Wd, and a final parallel wide width region Ta, Tb, Tc and Td.

The receiving portion occupies midway the wide width region of Ta, Tb, Tc and Td. The transmitting portion is allotted at extensions of final ends of the wide width region Ta, Tb, Tc and Td. A final end of the insulating layer 3 is exposed without the lightwaveguide layer 4. The rear ends of the lightpaths A, B, C and D appear at a vertical section 10 of the lightwaveguide layer 4 as shown in FIG. 6 and FIG. 7. Four laser diodes LDa, LDb, LDc and LDd are epi-down (upside down) mounted at extensions of Ta, Tb, Tc and Td on the metallized patterns 5. Active stripes (emission stripes) of the laser diodes lie on the extensions of the lightpaths Ta, Tb, Tc and Td. Transmitting signal beams emitted from the laser diodes LDa, LDb, LDc and LDd are directly coupled to the lightpaths A, B, C and D.

A slanting lateral groove 7 is perforated halfway on the wide width region of the lightwaveguide layer 4. A wavelength selective filter 6 is inserted and fitted in the slanting groove 7. The wavelength selective filter 6 has a function of allowing the LD transmitting $\lambda_1$ signal beams to pass but of reflecting the PD receiving $\lambda_2$ beams from the ribbonfiber slantingly upward. A submount 8 with a top metallize and vertical partitioned holes. Four bottom incidence type photodiodes PDa, PDb, PDc and PDd are mounted on a top of the submount just above the lightpaths Ta, Tb, Tc and Td.

A ribbonfiber and the module exchange optical signals by the following manner. Receiving signal beams propagating in element fibers of the ribbonfiber go into starting ends Sa, Sb, Sc and Sd of the narrow width region on the bench, run in the lightpaths A, B, C and D, extend also in a lateral direction at the width enlarging region of Wa, Wb, Wc and Wd of the lightpaths, arrive at the wide width region of Ta, Tb, Tc and Td, and shoot the slanting wavelength selective filter 6. The wavelength selective filter 6 reflects the receiving signal beams slantingly upward via the vertical holes to the bottom incidence type photodiodes PDa, PDb, PDc and PDd, which yield photocurrents in proportion to the powers of the receiving signal beams.

Embodiment 2 perforates two longitudinal V-grooves 24 at side fronts on the silicon bench 2. The V-grooves 24 can be made by anisotropic etching of single crystal silicon with a definite orientation. Columnar guidepins 25 are embedded in the V-groove 24 with an adhesive. A half-product has a vertical section as shown in FIG. 6.

FIG. 5 shows a plan view of Embodiment 2 joined with an MT connector 27 holding a final end of a four-core ribbonfiber 28 with four element fibers ($2^m=4$; m=2). The MT connector 27 has two longitudinal guideholes 26 on a front. Element fibers have a cladding of a 125 $\mu$m diameter and a core of a 10 $\mu$m diameter. A ribbonfiber 28 contains four element fibers of a 125 $\mu$m cladding and outer resin part Ha, Hb, Hc and Hd. The ribbonfiber is kept by the MT connector 27. An end of the ribbonfiber has the same plane as an end of the MT connector. The MT connector 27 has the longitudinal guideholes 26 on both front edges to accept the columnar guidepins 25. When guidepins 25 are inserted in the guideholes 26, the ribbonfiber Ha, Hb, Hc and Hd face the lightpaths of the narrow region Sa, Sb, Sc and Sd directly. Thus the guidepins 25 and the two guideholes 26 allow the module to attach the MT connector in a vertical direction and a width direction correctly.

Since FIG. 6 is a vertical section cutting in a vertical plane containing a guidepin, a lightpath core appears halfway in the lightwaveguide layer 4. Since FIG. 7 is a vertical section cutting in another vertical curved plane containing a lightpath (core), the lightpath appears allover in the lightwaveguide layer.

The laser diodes LDa, LDb, LDc and LDd yield the transmitting signal beams in a forward direction. The transmitting beams directly go into the final ends Ta, Tb, Tc and Td, run in the lightpaths A, B, C and D, approach to each other in Wa, Wb, Wc, and Wd, reach Sa, Sb, Sc and Sd of the narrow width region and enter Ha, Hb, Hc and Hd of the ribbonfiber.

The receiving signal beams emitted from the element fiber Ha, Hb, Hc and Hd of the ribbonfiber enter the lightpaths A, B, C and D via the narrow initial ends Sa, Sb, Sc and Sd, run in the lightpaths, expand in a lateral direction at the enlarging region of Wa, Wb, Wc and Wd, arrive at the wide width region of Ta, Tb, Tc and Td, and collide with the wavelength selective filter 6. The receiving signal beams are reflected by the wavelength selective filter 6 upward, go through the vertical holes and enter the photodiodes PDa, PDb, PDc and PDd on the submount 8. The photodiodes PDa, PDb, PDc and PDd make photocurrents in proportion to the receiving optical signals.

Figure 8:
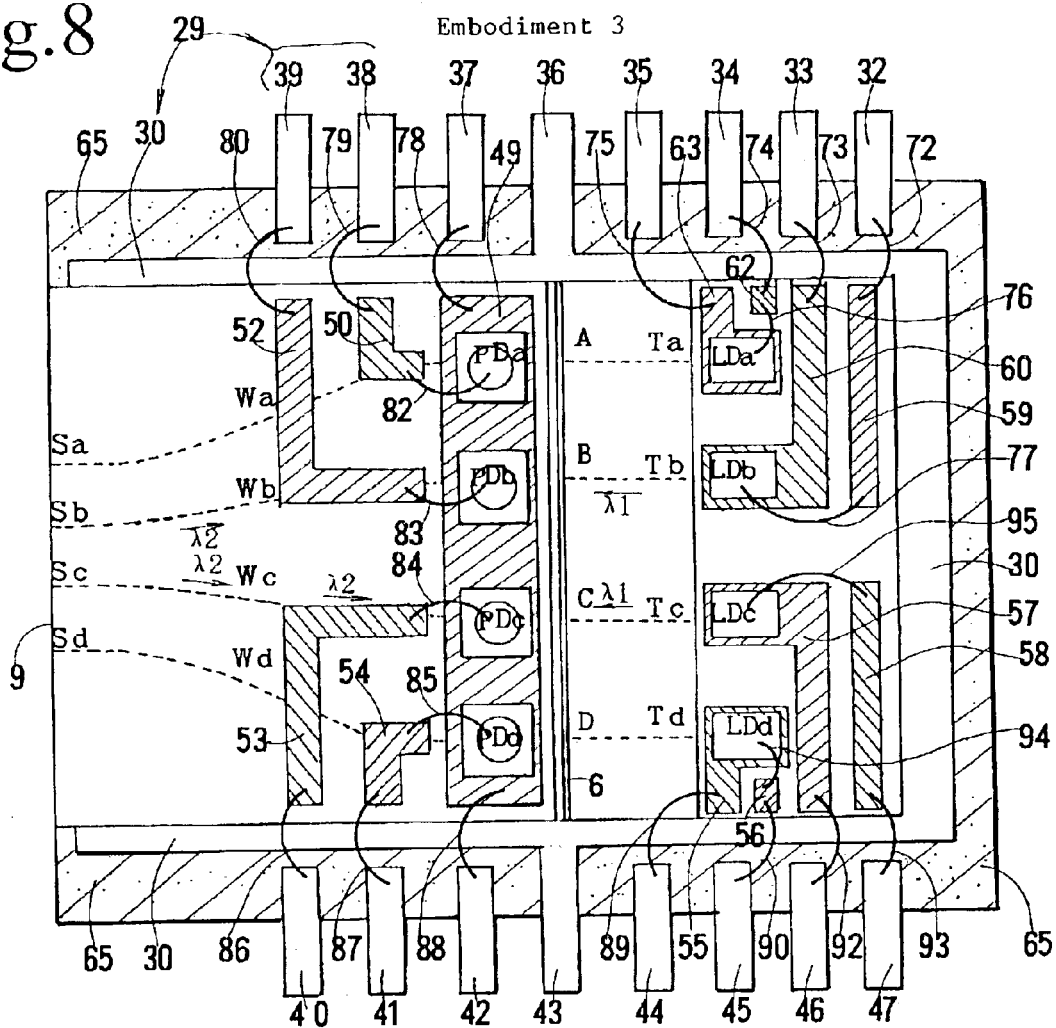
FIG. 8 is a plan view of another parallel LD/PD module as Embodiment 3 which has metallized patterns for PDs at a middle region and metallized patterns for LDs at a back end of the substrate, leadpins and wires for connecting the metallized patterns with the leadpins.
Figure 9:
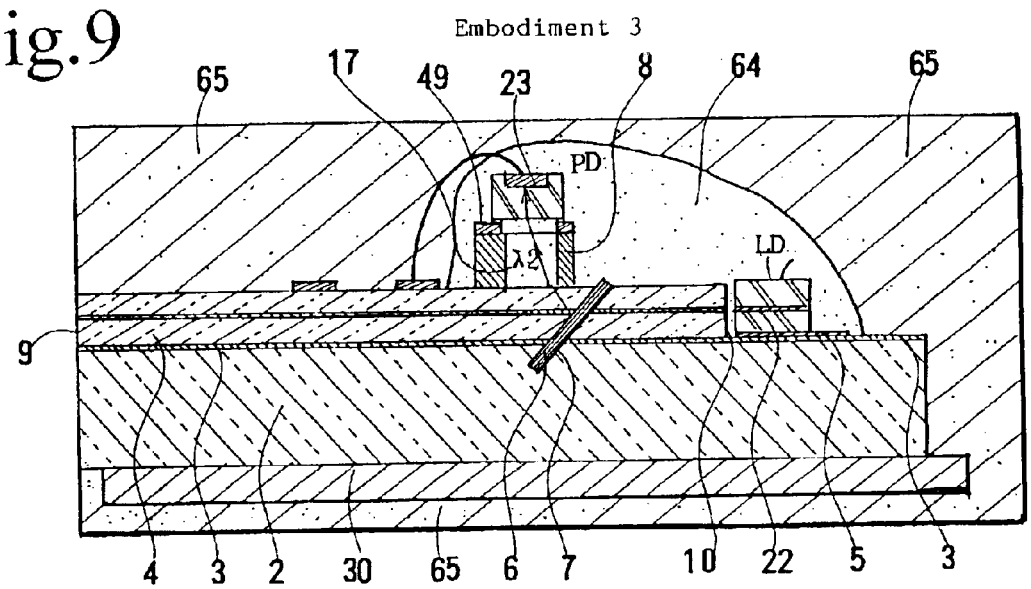
FIG. 9 is a vertically sectioned view of Embodiment 3 having the back LD metallizes, the middle PD metallizes, the leadpins and the wires.

[Embodiment 3 (Metallized Wirings on Enlarging Region, Leadframe; FIG. 8, FIG. 9)]

The present invention allocates an enlarging region with a sufficient length for moderately enlarging the lightpaths which should be immune from dissipation loss. Since a sufficient area on the enlarging region is vacant in Embodiments 1 and 2, Embodiment 3 tries to make the best use of the vacant space upon the enough wide enlarging region. Since the enlarging region is neighboring to a receiving portion, it is favorable to make wiring patterns and preamplifiers for the receiving portion. Embodiment 3 prepares PD wiring patterns on the enlarging region and fits a leadframe with leadpins on a bottom of a silicon bench for coupling inner wirings to external circuits. FIG. 8 is a plan view of Embodiment 3 including the leadframe, wirings of PDs and LDs and a package. FIG. 9 is a vertical section of Embodiment 3 containing the package.

Embodiment 3 includes a rectangular silicon bench 2, a plurality of lightpaths being made upon the silicon bench 2 and having a starting narrow width region, an intermediate width enlarging region and a final wide width region, a signal receiving portion containing a plurality of photodiodes, a signal transmitting portion containing a plurality of light emitting devices (laser diodes or light emitting diodes), PD metallize wirings formed on the enlarging region for the signal receiving portion, LD metallized wirings formed at a final end on the silicon bench for the transmitting portion, a leadframe with many leadpins, and a package containing the silicon bench, the PDs, the LDs and the leadframe.

A thin insulating layer 3, e.g., of silicon dioxide $SiO_2$, is made upon the silicon bench 2. A transparent lightwaveguide layer 4 is made on the insulating layer 3 except a final end portion. In the example, four lightpaths (cores) A, B, C and D are made in the lightwaveguide layer 4. Signal optical beams can propagate in the lightpaths in both directions.

The lightpaths A, B, C and D formed in the lightwaveguide layer have a narrow width region Sa, Sb, Sc and Sd, a width enlarging region of Wa, Wb, Wc and Wd, and a wide width region of Ta, Tb, Tc and Td.

The signal receiving portion is installed at an intermediate point on the wide width region of Ta, Tb, Tc and Td. The signal transmitting portion is installed on extensions of the final ends of Ta, Tb, Tc and Td. In the concrete, the final ends of Ta, Tb, Tc and Td are exposed on a tiny vertical end plane 10 of the lightwaveguide layer 4. Metallized patterns 5 are prepared on end region on the exposed insulating layer 3. Laser diodes LDa, LDb, LDc and LDd of the transmitting portion are epi-down (upside down) mounted upon the metallized patterns 5. The laser diodes produce transmitting signal beams. The transmitting signal beams go into the final ends Ta, Tb, Tc and Td of the lightpaths A, B, C and D.

A slanting groove 7 is formed at a wide interval region of the lightwaveguide layer 4 in the direction vertical to the lightwaveguides. A wavelength selective filter 6, which is a dielectric multilayered filter made by piling different dielectric layers in turn, is inserted into the slanting groove 7. The wavelength selective filter 6 has a function of allowing transmitting LD light to pass therethrough without loss and reflecting receiving light from a element fibers in a upward direction. A submount 8 having vertical holes is fitted on the wide interval region slanting upward in front of the slanting wavelength selective filter 6. The submount 8, which is an insulator, has a metallized pattern on the top. Bottom incidence type photodiodes PDa, PDb, PDc and PDd are mounted at positions just above wide interval lightwaveguides Ta, Tb, Tc and Td on the submount by bonding bottom n-electrodes (cathodes) to the top metallized patterns.

The bottom of the silicon bench 2 is furnished with a leadframe 29 which is made by cutting a thin metallic plate into complex leadpins and wiring segments (patterns). Initially the leadframe has an outer square frame (not appearing in the figures), leadpins 32 to 47 extending inward from the outer square frame, ground leads 36 and 43 extending from the outer frame and a basemetal 30 supported by the ground leads 36 and 43. The leadpins 32 to 47 and the basemetal 30 lie at the same height as the bottom of the silicon bench 2.

Wiring patterns are made upon the width enlarging region for connecting the photodiodes PDa, PDb, PDc and PDd to leadpins. A common wiring pattern 49 for the cathodes of the photodiodes is made upon the top of the submount. The cathode submount pattern 49 is connected to leadpins 37 and 42 by wires 78 and 88. The cathodes of the photodiodes are connected via the leadpins 37 and 42 to a power source voltage or another definite positive voltage for applying inverse biases to the photodiodes.

Printing or evaporation prepares metallized patterns 50, 52, 53 and 54 on the width enlarging region. The figures indicate metallized patterns or wirings by hatching. Anodes (p-electrodes) of the photodiodes PDa, PDb, PDc and PDd are connected to the metallized patterns 50, 52, 53 and 54 by wires 82, 83, 84 and 85. Photocurrents flowing out the anodes of the photodiodes are receiving signals. The metallized patterns 50, 52, 53 and 54 are joined to the leadpins 38, 39, 40 and 41 by wires 79, 80, 86 and 87.

Metallized wirings 55, 56, 57, 58, 59, 60, 62 and 63 for upholstering laser diodes LDa, LDb, LDc and LDd are made upon the insulating layer at the back, which is free from the lightwaveguides, of the silicon bench 2 by printing or evaporating.

The laser diodes LDa, LDb, LDc and LDd are epi-down (upside down) mounted upon the metallized wiring 63, 60, 57 and 55 respectively. Stripes (p-electrodes or anodes) are directly soldered upon the metallized wirings.

Tops of the laser diodes have cathodes (n-electrodes) which are formed overall or partly upon the tops.

A wire 76 connects a cathode of the laser diode LDa to a metallized pattern 62. Another wire 77 joins a cathode of the laser diode LDb to a metallized pattern 59. Another wire 93 joins a cathode of the laser diode LDc to a metallized pattern 58. A wire 94 connects a cathode of the laser diode LDs to a metallize 56.

A wire 74 connects the LDa metallize 62 to a leadpin 34. Another wire 72 joins the LDb metallize 59 to a leadpin 32. Another wire 93 joins the LDc metallize 58 to a leadpin 47. Another wire 90 connects the LDd metallize 56 to a leadpin 45.

The leadpins, the metallizes on the silicon bench and the metallized patterns on the lightwaveguide layer lie at different heights. The wires connect two points at different levels.

Mounting of chips and wirebonding among chips and patterns are succeeded by coating the laser diodes, the photodiodes, the ends of the lightwaveguides with an elastic transparent resin 64 which has favorably a refractive index similar to the lightwaveguide layer. The transparent resin 64 is, for example, a transparent silicone resin or a transparent acrylate resin. If the transparent resin 64 has a refractive index closely equal to the lightwaveguides layer, scattering and reflection at the ends of the lightpaths are reduced. The transparent resin 64 which fills the vertical holes of the submount 8 guides the light reflected by the wavelength selective filter 6 to the photodiodes without scattering. The transparent resin 64 allows light beams emitted from the laser diodes LDa, LDb, LDc and LDd to enter the wide width ends Ta, Tb, Tc and Td of the lightpaths at the region without scattering or reflection. The transparent resin has another function of protecting the laser diodes and the photodiodes from external shocks by abundant elasticity.

A half-product comprising the silicon bench, the photodiodes, the laser diodes and the transparent resin is further packaged with a harder opaque resin 65, e.g., epoxy, which optionally includes a pigment. Transfermolding in a metallic mould produces air-tight, rigid plastic package. The plastic packages are suitable for mass-scale production of low-cost modules.

Transmitting signal beams emanating from the laser diodes LDa, LDb, LDc and LDd go into the wide width ends of the lightpaths, travel via the enlarging region backward, go out of the narrow width ends and go into ends of ribbonfibers.

Receiving signal beams emitted from the ribbonfibers go into the narrow width ends Sa, Sb, Sc and Sd of the lightpaths A, B, C and D, travel the enlarging region Wa, Wb, Wc and Wd, reach the wide width region Ta, Tb, Tc and Td. The receiving beams are reflected by the wavelength selective filter 6 slantingly upward, penetrate the vertical holes of the submount 8 and go into the photodiodes PDa, PDb, PDc and PDd which produce photocurrents in proportional to the receiving signals.

Embodiment 3 can be joined to a tapefiber with ribbonfibers by an appropriate device. Otherwise, Embodiment 3 can be attached to an MT connector by guidepins or guideholes like Embodiment 2.

Figure 10:
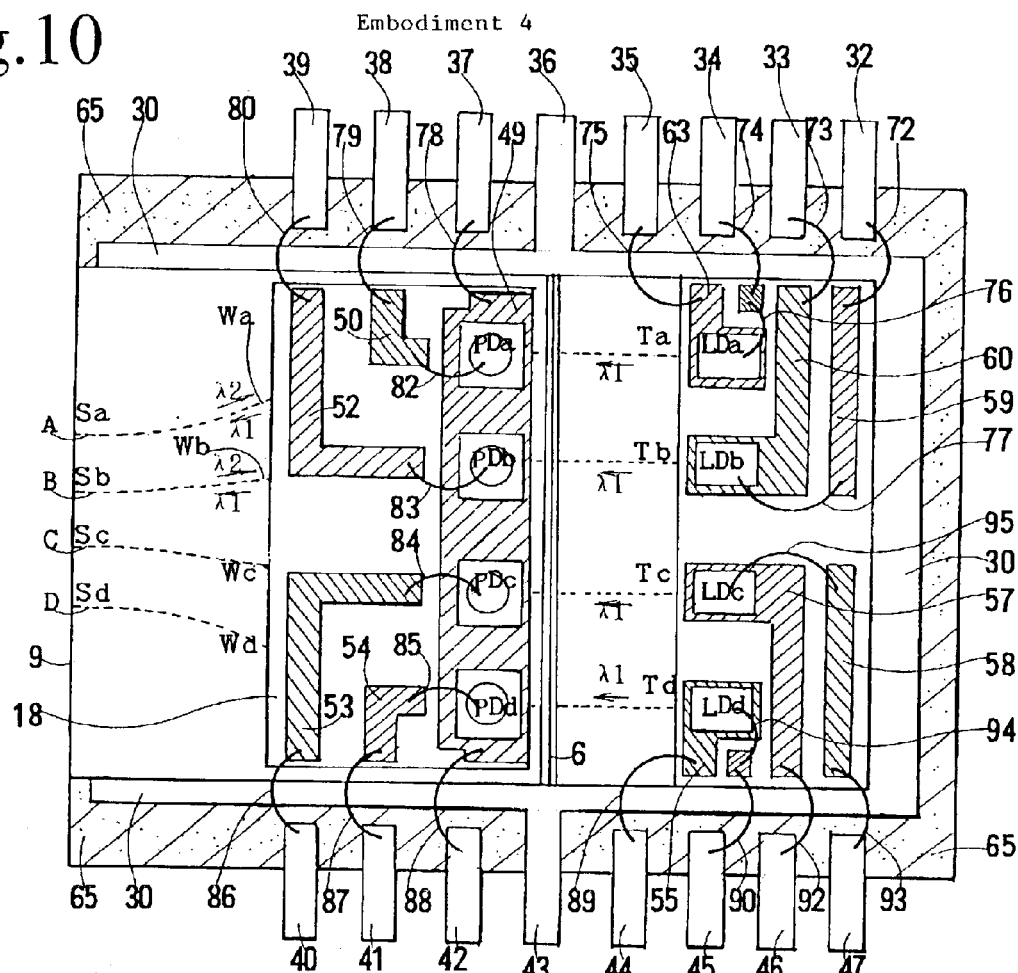
FIG. 10 is a plan view of Embodiment 4 which has metallized patterns for PDs on a submount fitted on a width enlarging region and other metallized patterns for LDs at a rear part of the substrate.
Figure 11:
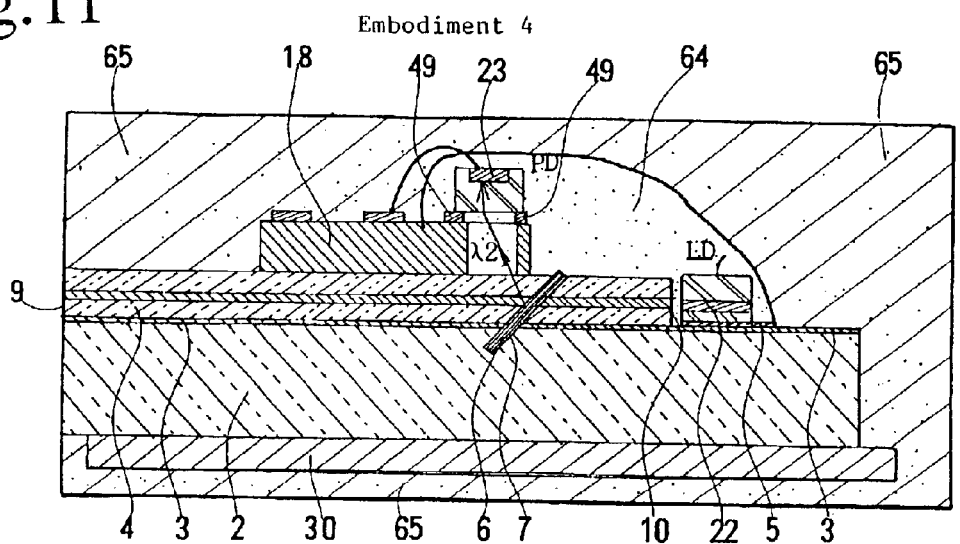
FIG. 11 is a vertical section of Embodiment 4 having the submount on the width enlarging region, the PDs on the submount, the LDs mounted at the end of the lightwaveguides on the rear end of the substrate, a transparent resin enclosing the PDs and the LDs, and a resin package.

[Embodiment 4 (Submount, Patterns on Width Enlarging Region, Leadframe; FIGS. 10, 11]

The free space on a width enlarging region can be effectively utilized by installing a submount and wiring patterns for photodiodes thereon. The PD wiring patterns made upon the submount can alleviate electrical crosstalk by enlarging the distance between the photodiodes and a laser diodes. Embodiment 4 provides the width enlarging region with the submount and the photodiode wiring patterns for the sake of sparing space and reducing crosstalk. A leadframe fitted on a bottom of a silicon bench 2 and LD wiring patterns are prepared at a rear end of the silicon bench 2 similarly to Embodiment 3.

FIG. 10 is a plan view of a substrate part of Embodiment 4 including leadpins and a package. FIG. 11 is a vertical section of the same embodiment.

Embodiment 4 makes a plurality of width enlarging lightpaths, a receiving part with a plurality of photodiodes, a transmitting part with a plurality of laser diodes, provides a width enlarging region with a submount with PD wiring patterns, makes LD wiring patterns on a rear end of the silicon bench and fits a leadframe on a bottom of the silicon bench.

The silicon bench 2 has a thin insulating layer 3, e.g., silicon dioxide ($SiO_2$) layer on the top. A transparent waveguide layer 4 is formed upon the insulating layer 3. In the example, four lightpaths A, B, C and D are made in the waveguide layer 4.

The lightpaths A, B, C and D prepared in the waveguide layer 4 has a narrow width region Sa, Sb, Sc and Sd having a narrower interval (spatial pitch), a width enlarging region Wa, Wb, We and Wd and a wide width region Ta, Tb, Tc and Td.

A wide submount is fitted from the width enlarging region to halfway of the wide width region Ta, Tb, Tc and Td on the Si bench 2. Receiving portion is placed on the wide submount and transmitting portion is positioned at an end of the wide width region. Laser diodes LDa, LDb, LDc and LDd of the transmitting portion are epi-down (upside down) mounted upon metallized patterns prepared at the back of an end plane 10 on the exposed region in the lightwaveguide layer 4.

A slanting lateral groove 7 is formed halfway on the wide width region of the lightwaveguide layer. A wavelength selective filter 6 is fixed in the slanting lateral groove 7. The wavelength selective filter 6 has a function of allowing transmitting light wavelength $\lambda_1$ of the laser diodes to pass and reflecting receiving light wavelength $\lambda_2$ from element fibers slantingly.

A wide submount 18 with vertical holes and metallized patterns is fitted upon the width enlarging region of the lightpaths. Bottom incidence type photodiodes PDa, PDb, PDc and PDd are mounted via a metallized pattern 49 on the submount above the wide lightpaths Ta, Tb, Tc and Td.

A leadframe 29 which is prepared by cutting a thin metal plate into a variety of leadpins, wirings and a base is glued on the bottom of the silicon bench 2. The leadframe 29 has an outer rectangular frame (not shown in the figures), a plurality of leadpins 32–47 extending inward from the outer frame and a basemetal 30 supported by ground leads 36 and 43. The leadpins 32–47 and the basemetal 30 lie at the same level as the bottom of the silicon bench 2.

The submount 18 has metallized patterns for photodiodes PDa, PDb, PDc and PDd. This submount 18 is larger than the previous submount 8. An extra margin of the submount 18 gives the space for metallized wirings for the photodiodes. The wirings upon the submount are farther distanced from the laser diodes, which are bonded at a back region of the silicon bench 2, than Embodiment 3. The additional separation by the submount further decreases electrical crosstalk between the lasers and the photodiodes.

The submount has a metallize 49 for bonding cathodes of the photodiodes thereon. The metallized 49 is connected via wires 78 and 88 to leadpins 37 and 42. The leadpins 37 and 42 are connected to a source voltage or a definite positive voltage for giving reverse biases to the n-electrodes (cathodes) of the photodiodes.

The submount 18 has other metallized wiring patterns 50, 52, 53 and 54 which are produced by printing or metal-evaporation. FIG. 10 discriminates metallized wiring patterns by hatching, which does not mean a section there. Anodes (p-electrodes) of the photodiodes PDa, PDb, PDc and PDd are joined to the metallized wiring patterns 50, 52, 53 and 54 via wires 82, 83, 84 and 85 respectively. Photocurrents flowing into the anodes are receiving signals. The metallized wiring patterns 50, 52, 53 and 54 are connected via wires 79, 80, 86 and 87 to the leadpins 38, 39, 40 and 41 respectively.

When LD chips and PD chips are mounted and wirings and leadpins are wirebonded, the photodiodes, the laser diodes, the ends of the lightpaths and other parts which catch or pitch light are covered with a transparent elastic resin 64 which has a refractive index similar to the lightwaveguides. The transparent resin 64 is e.g., a silicone resin or an acrylate resin. Since the transparent resin 64 has a refractive index akin to the lightwaveguides, random scattering and reflection at the ends of the lightwaveguides are reduced. A part of the transparent resin 64 which fills the holes of the submount 18 guides the receiving signal beams reflected by the wavelength selective filter 6 to the photodiodes without scattering and reflection. Another part of the transparent resin 64 leads transmitting beams emitted from the laser diodes LDa, LDb, LDc and LDd to the final ends Ta, Tb, Tc and Td of the lightpaths at the wide width region. The transparent resin 64 has another function of protecting the LDs and the PDs by absorbing external shocks and forcing with sufficient elasticity.

A half-product covered with the transparent resin 64 is further enclosed by a hard resin 65, which optionally contains a pigment. The hard resin forms a rigid, hard, air-tight plastic package. The plastic package is made by transfer-molding half-products with the resin in a metallic mould. The plastic moulding gives low-cost, high-reliability packages suitable for large scale production.

Embodiment 4 can be joined to a ribbonfiber with element fibers of the number equal to channel number by some means. For example, guidepins and guideholes can be made on contacting faces of modules or connectors for the purpose like Embodiment 2.

[Embodiment 5 (Preamplifier on Enlarging Region; Monitoring PDs; FIG. 12, FIG. 13)]

A curving enlarging region has a wide area, since excess curvature should be forbidden for avoiding dissipation loss. Embodiment 5 tries to make the best use of the wide space on the enlarging region by installing a preamplifier upon the enlarging region. Photocurrents of photodiodes are feeble, high-impedance currents which are susceptible to external noise or electric crosstalk from laser diodes. It is preferable to install a preamplifier for amplifying the photocurrents induced from the photodiodes in the vicinity of the photodiodes. Receiving signals become immune from noise or crosstalk by amplifying weak photocurrents by a neighboring preamplifier. In addition, monitoring photodiodes can be furnished at the back of the laser diodes for monitoring and maintaining the powers of the laser diodes.

FIG. 12 is a plan view of a multichannel LD/PD module of Embodiment 5 containing a package. FIG. 13 is a sectional view of the same Embodiment including the package.

Embodiment 5 is built upon a silicon bench 2. A thin insulating layer 3, for example, silicon dioxide ($SiO_2$) is produced upon the silicon bench 2. A transparent lightwaveguide layer 4 is made upon the insulating layer 3. Four (M=4) lightpaths (lightwaveguide cores) A, B, C and D are formed in the lightwaveguide layer 4.

The lightpaths A, B, C and D prepared in the lightwaveguide layer 4 include a front narrow width region of Sa, Sb, Sc and Sd, a curving width enlarging region of Wa, Wb, Wc and Wd, which are concealed by a submount in FIG. 12, and a final wide width region Ta, Tb, Tc and Td.

A wide submount 18 is laid upon the width enlarging region. A receiving portion is upholstered upon the submount 18. A signal transmitting portion is installed behind ends of the wide width region of the lightpaths.

A slanting groove 7 is slantingly perforated in a lateral direction at an intermediate position on the wide width region. A wavelength selective filter 6 which reflects $\lambda_2$ (PD) but allows $\lambda_1$ (LD) to pass is embedded in the slanting groove 7.

A wide, insulating submount, which has vertical holes and metallized pads 98, 99, 100 and 101, is fixed upon the width enlarging region of the lightwaveguides. An integrated preamplifier 97, which preamplifies photocurrents of PDs, is furnished on a front half of the submount. A single-source preamplifier requires four pads of a source pad, a ground pat, an input pad and an output pad per PD. A double-source preamplifier requires five pads of a plus-source pad, a minus-source pad, a ground pat, an input pad and an output pad per PD.

FIG. 12 shows the integrated preamplifier which is common to four PDs. In stead of the integrated one, four separated preamplifiers can be aligned on the substrate for preamplifying photocurrents of each photodiode. Photodiodes PDa, PDb, PDc and PDd are bonded upon metallized pads 98, 99, 100 and 101. The preamplifier 97 has eighteen pads on the top which are sufficient for the single source type. In the case of the double source type one, the plus pads or the minus pads can be commonly connected to the photodiode electrodes, which can save the pads on the top. The cathode pad 98 of PDa is connected to a source pads 104 of the preamplifier 97 by a wire 106. A top anode 102 of PDa is connected to an input pad 105 of the preamplifier 97 by a wire 107. Other pads on the preamplifier 97 are a ground pad or output pad. Other three PDb, PDc and PDd have wirings similar to PDa. Readpins 108, 109, 135 and 136 are added on both sides for the preamplifier.

Laser diodes LDa, LDb, LDc and LDd are epi-down (upside down) bonded upon metallized patterns formed on the silicon bench at the back of the ends of the lightpaths Ta, Tb, Tc and Td appearing on an end plane 10 of the lightwaveguide layer 4. LD-related metallized patterns, which are have been described in Embodiments 3 and 4, are not shown in detail in FIG. 12. The laser diodes LDa, LDb, LDc and LDd emit forward light partly and backward light partly in both directions. Power of the backward light is in proportion to the forward light. Metallized patterns 122, 123, 124 and 125 are formed just behind the laser diodes LDa, LDb, LDc and LDd. Monitoring photodiodes MPa, MPb, MPc and MPd are bonded upon the metallized patterns 122, 123, 124 and 125. The monitoring photodiodes MPa, MPb, MPc and MPd sense the power of the backward light of the laser diodes for stabilizing output of the laser diodes by regulating driving currents for compensating the change of LD power. Additional leadpins 126–130 and 132–134 are formed at the back of the package for connecting with the monitoring photodiodes.

A transparent resin 64 is supplied to the laser diodes, the photodiodes, the ICs and the lightpaths which exchange light beams for reducing scattering loss and reflection loss. Half-products having the silicon bench and the transparent resin are further transfermolded with a harder, opaque resin 65 into completed modules like Embodiments 3 and 4.

[Embodiment 6 (Preamplifier & LD-driving IC on Enlarging Region; FIGS. 12 and 13)]

Instead of monitoring photodiodes, LD driving ICa, ICb, ICc and ICd can be installed at the back of the laser diodes for driving the laser diodes LDa, LDb, LDc and LDd. Access of the driving ICs to the laser diodes enables Embodiment 6 to drive the laser diodes LDa, LDb, LDc and LDd at a high speed more than 1 Gbps by alleviating inductances L and resistances R of wirings connecting the LDs and the driving ICs. An integrated preamplifier 97 is furnished on the width enlarging region for amplifying photocurrents of the photodiodes like Embodiment 5.

Figure 14:
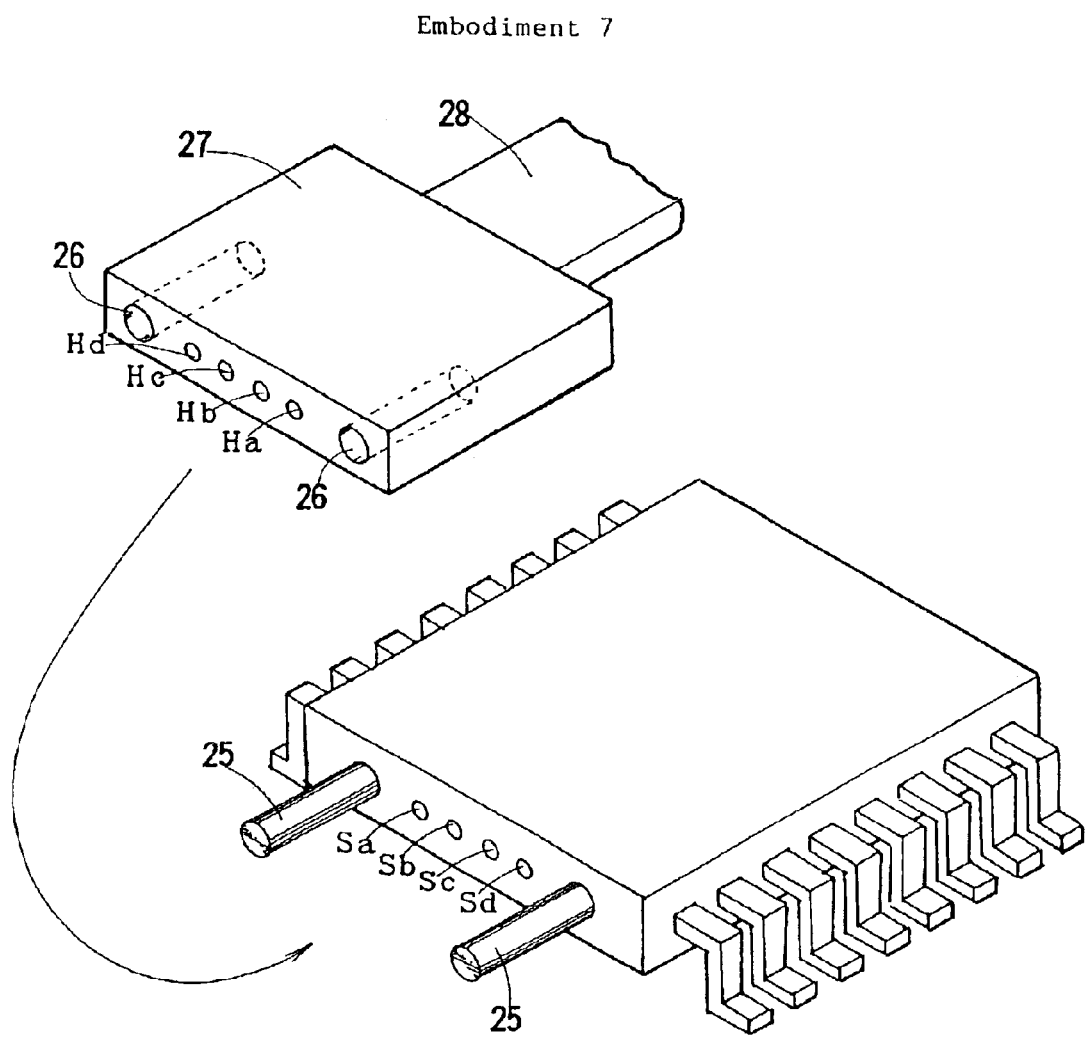
FIG. 14 is a perspective view of an MT connector of a tapefiber and an LD/PD module in a separated state as Embodiment 7, in which the LD/PD module has two guidepins on the front and the MT tapefiber connector has guidepin holes.

[Embodiment 7 (Joining to MT Connector, Pins/Module & Holes/Connector; FIG. 14)]

Embodiment 2 (FIG. 6) exhibits an LD module with guidepins and an MT connector with guidepin holes. Embodiment 7 has a similar coupling structure to Embodiment 2. MT connector 27 maintains an end of four-core ribbonfiber (tapefiber, fiberribbon). Optionally, the ribbonfiber seized by the MT connector can be eight-core fiber, sixteen-core fiber and so on.

In Embodiment 7, the MT connector 27 has parallel guidepin holes 26 extending in the longitudinal direction on sides of a front surface. Spot ends Ha, Hb, Hc and Hd appear on the front surface at a 250 µm pitch.

Guidepins 25 are fitted on a front end of the module with the same interval of the guideholes of the MT connector. Ends Sa, Sb, Sc and Sd of a narrow width lightpaths appear on the front end at a 250 µm pitch. When the connector is coupled to the MT connector, fibers Ha, Hb, Hc and Hd face with front ends Sa, Sb, Sc and Sd of the module for exchanging optical signals between the module and the ribbonfiber. Such a pin/hole fitting mode can be applied to Embodiments 1, 3, 4, 5 and 6.

Figure 15:
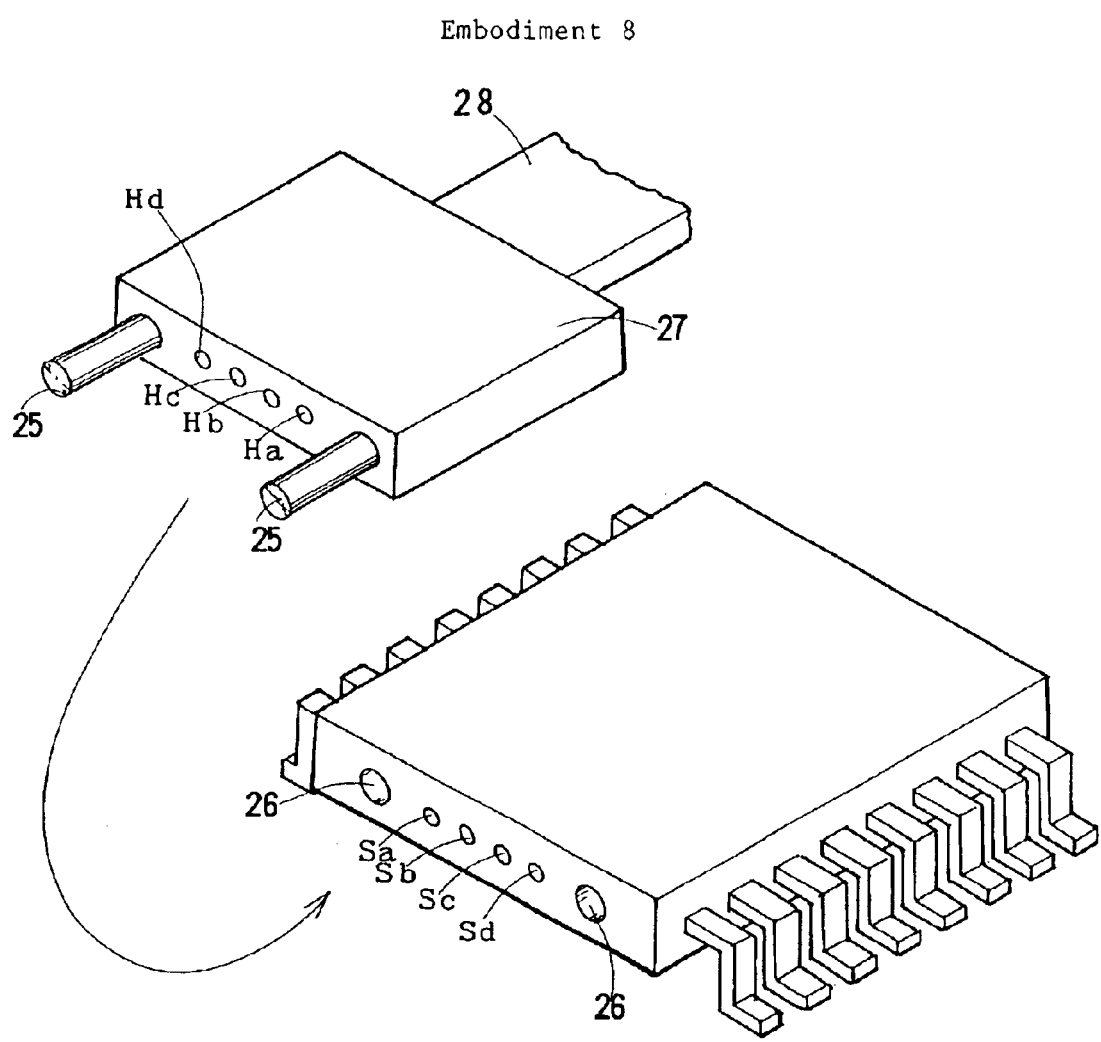
FIG. 15 is a perspective view of another MT connector of a tapefiber and an LD/PD module in a separated state as Embodiment 8, in which the LD/PD module has two guidepin holes on the front and the MT tapefiber connector has guidepins projecting on the forehead.
Figure 16:
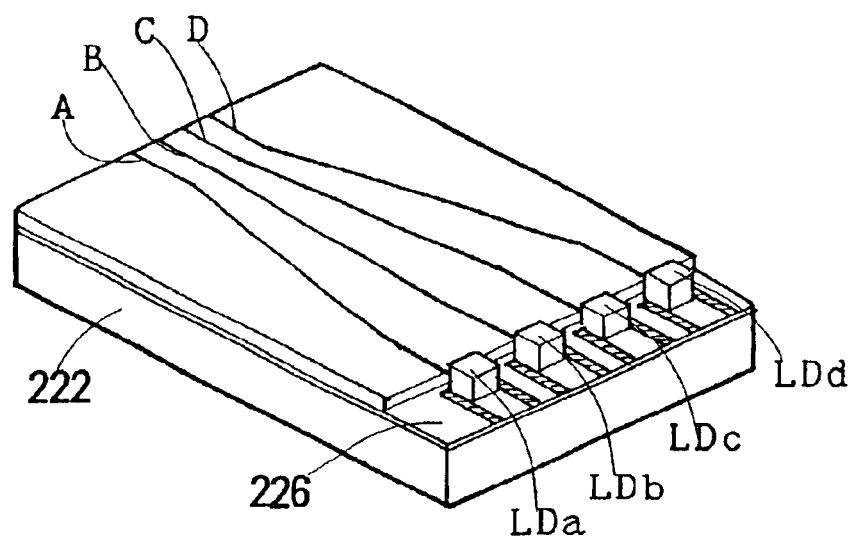
FIG. 16 is a perspective view of a four-channel parallel LD module proposed by ① Masato Shishikura, Kazuyuki Nagatuma, Tatsumi Ido, Masahide Tokuda, Koji Nakahara, Etsuko Nomoto, Tsurugi Sudoh & Hirohisa Sano, "10 Gbps×4 channel parallel LD module", Proceeding of the 2001 Communications Society Conference of IEICE General Conference, C-3-50, p160.

[Embodiment 8 (Joining to MT Connector, Holes/Module & Pins/Connector; FIG. 15)]

Embodiment 2 (FIG. 6) exhibits an LD module with guidepins and an MT connector with guidepin holes. Embodiment 8 has another type of coupling structure reverse to Embodiment 7. Embodiment 8 shows a multi-channel module having the guidepins 25 formed in the MT connector and the guidepin holes 26 made on the module. It allows the module and the MT connector to make a join unite.

In Embodiment 8, an MT connector 27, which maintains ends of four-core ribbonfiber (tapefiber, fiberribbon) 28, has parallel guidepins extending in the longitudinal direction on a front surface. Spot ends Ha, Hb, He and Hd appear between the guidepins at a 250 µm pitch on the front surface of the Mt connector 27.

Guidepin holes 26 are perforated on a front end of the module with the same interval as the guideholes of the MT connector. Ends Sa, Sb, Sc and Sd of a narrow width lightpaths appear on the front end at a 250 µm pitch between the guidepin holes 26. The module is coupled to the MT connector 27 by inserting the guidepins 25 of the MT connector 27 to the guidepin holes 26 of the module. Fibers Ha, Hb, He and Hd directly face with front ends Sa, Sb, Sc and Sd of the module for exchanging optical signals between the module and the ribbonfiber. Such a pin/hole fitting mode can also be applied to Embodiments 1, 3, 4, 5 and 6.

[Embodiment 9 (Fiber Type Lightwaveguide)]

Previous Embodiments are modules which use inorganic $SiO_2$ lightwaveguides or organic polyimide lightwaveguides as lightpaths formed on a Si bench. The lightpaths can be formed to use optical fibers. In the case of using the optical fibers, M curved V-grooves having a narrow region, a width enlarging region and a wide width region are perforated on the bench. The fibers are filled in curved V-grooves and are fixed by a resin. The V-grooves allow the fibers to find their optimum positions on the bench. Ends of the fibers Sa, Sb, Sc and Sd on a front end region have the same plane as the package by polishing.

The period (250 µm) of element fibers contained in a standardized ribbonfiber is too narrow. Sides (300 µm–500 µm) of photodiodes or laser diodes are larger than the ribbonfiber period (250 µm). If a plurality of parallel straight lightpaths were made upon a bench of a module at the same period as the ribbonfiber, neither set of a plurality of laser diodes nor photodiodes could be arranged at ends or halfway of the parallel lightpaths. The present invention forms a plurality of parallel curved lightpaths, which include a narrow width region, a width enlarging region and a wide width region, on a bench for allotting a set of laser diodes at ends of the wide width region and allocating a set of photodiodes halfway upon the wide width region. Curving lightpaths give a module enough margins for accommodating laser diodes and photodiodes. Enlarging of lightpath width enables the present invention to ensure the space for mounting the laser diodes at the ends of lightpaths and the photodiodes at midway regions of lightpaths. The curving, enlarging lightpaths bring about the following advantages.

(1) The present invention gives an inexpensive, small-sized parallel LD/PD module which can be applicable to attach to a connector having a standardized ribbonfiber containing parallel element fibers at a pitch of 250 µm.

(2) An enlarging region of lightpaths gives a sufficient space for forming wiring patterns for photodiodes thereupon. Exploitation of the space brings an advantage of decreasing the size and cost of the module. The enlarging region can also be utilized for mounting a preamplifier, which enhances receiving sensitivity further.

(3) Mounting the photodiodes halfway on a wide width region of the lightpaths allows the module to widen the pitch of arranging the photodiodes. Wide distance between the neighboring photodiodes reduces optical and electrical mutual crosstalk.

(4) Positioning laser diodes at ends of the wide width region of the lightpaths enables the module to ensure the wide distance between neighboring laser diodes. The wide distance decreases electrical mutual crosstalk between the laser diodes.

(5) Provision of guidepins or guideholes enables the present invention to couple to a connector standardized on optical communications, e.g., an MT connector. The standardized interface enhances the scope of applicability and reduces the cost.

(6) Transfermolding a hard resin material with a wired silicon bench in a metallic mould gives a plastic package to the present invention module. The present invention is suitable for large scale-production.

We claim:

1. A parallel light emitting device—photosensitive device module for coupling to a multichannel optical transmission medium with a plurality of parallel optical fibers arrayed with a defined pitch, comprising:

a bench;

a plurality of lightpaths including a narrow width region, a curving width enlarging region and a wide width region and being made on the bench;

a transmitting portion including a plurality of light emitting devices or an array of light emitting devices mounted at ends of the wide width region of the lightpaths for yielding transmitting light signals;

a selective reflection device mounted upon the wide width region of the lightpaths for reflecting receiving light signals propagating in the parallel optical fibers but allowing the transmitting light signals for the light emitting devices to pass through; and a receiving portion including a plurality of photodiodes or a photodiode array mounted above the wide width region of the lightpaths for sensing the reflected receiving signals.

2. The parallel light emitting device—photosensitive device module according to claim 1, wherein the lightpaths are curved optical fibers which are fitted on the bench and have the narrow width region, the curving width enlarging region and the wide width region.

3. The parallel light emitting device—photosensitive device module according to claim 1, wherein the lightpaths are curved lightwaveguide cores which are produced by forming a transparent lightwaveguide layer on the bench and making curved core lines with a higher refractive index in the lightwaveguide layer and have the narrow width region, the curving width enlarging region and the wide width region.

4. The parallel light emitting device—photosensitive device module according to claim 3, wherein the selective reflecting device is a wavelength selective filter which has a function of reflecting the receiving light signals propagating in the parallel optical fibers but allowing the transmitting light signals for the light emitting devices or the array of light emitting devices to pass through and is inserted into a slanting groove slantingly perforated at the wide width region of the lightpaths on the bench.

5. The parallel light emitting device—photosensitive device module according to claim 4, wherein the photodiodes and the photodiode array are bottom type incidence photodiodes receiving light entering from a bottom surface of the photodiodes or the photodiode array.

6. The parallel light emitting device—photosensitive device module according to claim 5, wherein the photodiodes or the photodiode array of the receiving portion are mounted upon a submount having vertical holes with partitions which is laid upon the wide width region of the lightpaths.

7. The parallel light emitting device—photosensitive device module according to claim 5, wherein the width enlarging region of the lightpaths has metallized wirings for connecting the photodiodes or the photodiode array to outer circuits.

8. The parallel light emitting device—photosensitive device module according to claim 6, wherein the light emitting devices or the array of light emitting devices of the transmitting portion are a plurality of laser diodes which are installed at the end of the lightpaths of the wide width region on the bench.

9. The parallel light emitting device—photosensitive device module according to claim 6, wherein a preamplifier for preamplifying photocurrents of the photodiodes or the photodiode array is installed upon the width enlarging region of the lightpaths.

10. The parallel light emitting device—photosensitive device module according to claim 6, wherein the submount has metallized wirings for connecting the photodiodes or the photodiode array to outer circuits.

11. The parallel light emitting device—photosensitive device module according to claim 6, wherein the light emitting devices or the array of light emitting devices of the transmitting portion are a plurality of light emitting diodes which are installed at the end of the lightpaths of the wide width region on the bench.

12. The parallel light emitting device—photosensitive device module according to claim 8, wherein the laser diodes yield forward emitting light and backward emitting light and a set of monitoring photodiodes are installed at backs of the laser diodes for sensing the backward emitting light of the laser diodes.

13. The parallel light emitting device—photosensitive device module according to claim 8, wherein a laser driving IC for driving the laser diodes is installed on a rear portion of the bench which is immune from the lightpaths.

14. The parallel light emitting device—photosensitive device module according to claim 8, wherein guideholes are perforated on a forefront of the package for attaching to and detaching from an optical connector which includes parallel optical ribbon fibers and guidepins on an end.

15. The parallel light emitting device—photosensitive device module according to claim 8, wherein guidepins are fitted on a forefront of the package for attaching to and detaching from an optical connector which includes parallel optical ribbon fibers and guideholes on an end.

16. The parallel light emitting device—photosensitive device module according to claim 15, wherein the number of the lightpaths is 4M (M is an integer), the narrow width region of the lightpaths has a 250 μm pitch which is equal to a standardized pitch of 4M element fibers in a ribbon fiber maintained in an MT connector.

17. The parallel light emitting device—photosensitive device module according to claim 16, further comprising a leadframe having leadpins and being fixed to the bench.

18. The parallel light emitting device—photosensitive device module according to claim 17, further comprising a resin package which is made by transfermolding a resin in a metallic mold and covers the bench, the transmitting portion, the receiving portion, the lightpaths except front ends of the lightpaths of the narrow width region, the guidepins and the leadpins.

19. The parallel light emitting device—photosensitive device module according to claim 18, wherein a magnifying ratio D/d is 1.5 to 6, wherein D is a larger final end pitch at the wide width region and d is an initial pitch at the narrow width region.

20. The parallel light emitting device—photosensitive device module according to claim 19, wherein a transparent resin which has a refractive index similar to the lightwaveguides covers the photodiodes, the light emitting devices and an end of the lightwaveguides for guiding light beams emitted from the light emitting devices to enter the wide width region without scattering and reflecting.

* * * * *